US009753083B2

(12) United States Patent
Akahori et al.

(10) Patent No.: US 9,753,083 B2
(45) Date of Patent: Sep. 5, 2017

(54) PARALLELISM ADJUSTING DEVICE AND PARALLELISM ADJUSTING METHOD

(71) Applicant: HONDA MOTOR CO., LTD., Tokyo (JP)

(72) Inventors: Shigeto Akahori, Tochigi (JP); Nobuo Kambara, Tochigi (JP)

(73) Assignee: HONDA MOTOR CO., LTD., Tokyo (JP)

( * ) Notice: Subject to any disclaimer, the term of this patent is extended or adjusted under 35 U.S.C. 154(b) by 40 days.

(21) Appl. No.: 14/269,650

(22) Filed: May 5, 2014

(65) Prior Publication Data
US 2014/0333334 A1 Nov. 13, 2014

(30) Foreign Application Priority Data

May 8, 2013 (JP) ................................. 2013-098605

(51) Int. Cl.
  *G01R 31/28* (2006.01)
  *G01R 1/04* (2006.01)
  *G01R 1/067* (2006.01)

(52) U.S. Cl.
  CPC ....... *G01R 31/2886* (2013.01); *G01R 1/0466* (2013.01); *G01R 1/06722* (2013.01)

(58) Field of Classification Search
  CPC .............. G01R 1/0466; G01R 31/2886; G01R 1/06722
  USPC ........................................................ 324/750
  See application file for complete search history.

(56) References Cited

U.S. PATENT DOCUMENTS

| 5,705,853 A * | 1/1998 | Faller ...................... H01L 24/72 257/177 |
| 2004/0012383 A1* | 1/2004 | Kimura .............. G01R 1/07328 324/763.01 |
| 2004/0239357 A1* | 12/2004 | Tashiro ................ G01R 1/0483 324/754.13 |
| 2005/0102828 A1* | 5/2005 | Suzuki ................... H01R 13/22 29/844 |

(Continued)

FOREIGN PATENT DOCUMENTS

| CN | 102549735 | 7/2012 |
| JP | 59-117229 | 7/1984 |

(Continued)

OTHER PUBLICATIONS

Chinese Office Action dated Jun. 12, 2016.

*Primary Examiner* — Tung X Nguyen
*Assistant Examiner* — Akm Zakaria
(74) *Attorney, Agent, or Firm* — Rankin, Hill & Clark LLP (57) ABSTRACT

A parallelism adjusting device and a parallelism adjusting method capable of adjusting the parallelism between the surface of a semiconductor and the surface of an electrode by reducing the load on the semiconductor and capable of shortening the cycle time by increasing the operating speed. A probe device of adjusting the parallelism between the surface and the surface of a contact body that is in contact with the surface to press the surface and apply a current is configured to include a pressing body assembly that presses the contact body with a predetermined pressing force until the surface and the surface come into contact with each other to adjust the parallelism and, after that, presses the contact body with a pressing force that is stronger than the predetermined pressing force.

3 Claims, 6 Drawing Sheets

(56) References Cited

U.S. PATENT DOCUMENTS

| | | | |
|---|---|---|---|
| 2006/0232291 A1* | 10/2006 | Wakabayashi | G01R 1/0483 324/756.02 |
| 2011/0276303 A1* | 11/2011 | Marshall | G01B 21/047 702/141 |
| 2012/0194213 A1 | 8/2012 | Komatsu et al. | |
| 2014/0231981 A1* | 8/2014 | Kojima | H01L 23/4093 257/690 |

FOREIGN PATENT DOCUMENTS

| | | |
|---|---|---|
| JP | 2006-337247 | 12/2006 |
| JP | 2007-218635 | 8/2007 |
| JP | 2009-294088 | 12/2009 |
| JP | 2011-137791 | 7/2011 |

* cited by examiner

PARALLELISM ADJUSTING DEVICE AND PARALLELISM ADJUSTING METHOD

This application is based on and claims the benefit of priority from Japanese Patent Application No. 2013-098605, filed on 8 May 2013, the content of which is incorporated herein by reference.

BACKGROUND OF THE INVENTION

Field of the Invention

The present invention relates to a parallelism adjusting device and a parallelism adjusting method. In particular, the present invention relates to a parallelism adjusting device and a parallelism adjusting method used for the inspection of a power semiconductor where the parallelism between the surface of the power semiconductor and the surface of an electrode needs to be adjusted.

Related Art

In the related art a technique is known in that a large-current probe pin for allowing the extremity of the probe pin to be in contact with a semiconductor so as to be electrified (for example, refer to Patent Document 1). In the technique disclosed in Patent Document 1, the probe pin is configured to include a contact member where a plurality of contact portions for electrifying are formed which are arranged in a distributive way, a plunger which is made of a rod-shaped conductive member and has a extremity to which the contact body is attached and a posterior extremity to which a wire end portion is connected, and a coil spring which exerts a force on the plunger so as to allow the contact body to be in contact with the semiconductor. In addition, a peripheral edge of the contact member is radially branched to constitute the contact portions, a central region of the contact member is fixed to the plunger by a fastener which is inserted into a fastener insertion hole in a depression of the extremity surface of the plunger, and the contact portion extends to the outer peripheral side from the inner peripheral edge of the depression.

According to the technique disclosed in Patent Document 1, the contact portion of the contact body is oscillated like a seesaw with respect to the inner peripheral edge of the depression as a supporting point when the contact portion is in contact with the semiconductor. Then, it is considered that at the time of oscillation, variation in contact pressure is alleviated by deformation of a portion close to the central region of the contact portion of the contact member, and thus, although there are some irregularities and unevenness at the probe-pin contact portion of the surface of the semiconductor, the contact state between the plurality of contact portions of the contact member and the surface of the semiconductor is aligned and stabilized.

[Patent Document 1] Japanese Unexamined Patent Application, Publication No. 2011-137791

SUMMARY OF THE INVENTION

Recently, semiconductors are configured with thin layers, and the internal structures thereof are complicated so that the semiconductors become vulnerable to physical loads. Therefore, a probe device needs to be configured so that contact operation is accurately controlled in order to reduce the load caused by weight concentration on the semiconductor when the surface of the semiconductor and the surface of an electrode such as the above-described contact member are in contact with each other. For this reason, the probe device requires elaborate operations so that the operating speed of the probe device is lowered. As a result, there is a problem in that the cycle time as the inspection time per semiconductor cannot be shortened.

The present invention is for solving the above-described problems and an object thereof is to provide a parallelism adjusting device and a parallelism adjusting method capable of adjusting the parallelism between the surface of the semiconductor and the surface of the electrode by reducing the load on the semiconductor and that is capable of shortening the cycle time by increasing the operating speed.

(1) A parallelism adjusting device (for example, the later-described probe device 1) for adjusting the parallelism between the surface (for example, the later-described surface 100f) of a semiconductor (for example, the later-described power semiconductor 100) and the surface (for example, the later-described surface 21f) of an electrode (for example, the later-described contact body 2) which is in contact with the surface of the semiconductor to press the surface and apply a current, the parallelism adjusting device including a pressing body (for example, the later-described pressing body assembly 3) which allows the surface of the electrode to be inclined so as to follow an inclination of the surface of the semiconductor and presses the electrode on to the semiconductor to be electrified when the surface of the semiconductor and the surface of the electrode are in contact with each other, wherein the pressing body presses the electrode with a predetermined pressing force until the surface of the semiconductor and the surface of the electrode are in contact with each other to adjust the parallelism and, after that, presses the electrode with a pressing force which is stronger than the predetermined pressing force.

According to the invention (1), the pressing body presses the electrode with a predetermined pressing force until the surface of the semiconductor and the surface of the electrode are in contact with each other to adjust the parallelism and, after that, presses the electrode with a pressing force which is stronger than the predetermined pressing force. Accordingly, the adjustment of the parallelism between the surface of the semiconductor and the surface of the electrode is performed not with an excessive pressing force but with the predetermined pressing force. For this reason, the surface of the electrode pressed by the predetermined pressing force can be easily inclined so as to follow the surface of the semiconductor. In addition, just after a portion of the surface of the semiconductor and a portion of the surface of the electrode come in contact with each other, although the operating speed is constant, the surface of the electrode pressed by the predetermined pressing force recedes from the surface of the semiconductor, so that the speed of narrowing the relative distance between the surface of the semiconductor and the surface of the electrode is lowered. Therefore, the contact made between the surface of the semiconductor and the surface of the electrode is smoothly performed while the parallelism is adjusted.

In addition, the application of currents after the adjustment of the parallelism is performed by the pressing force which is stronger than the predetermined pressing force. For this reason, after the parallelism is adjusted, the electrode is pressed by the pressing force which is stronger than the predetermined pressing force, so that the weight concentration on the semiconductor is minimized, and thus, the load is reduced. In addition, the current which needs to be applied while pressing can flow well from the electrode into the semiconductor.

Like this, it is possible to reduce the load on the semiconductor and, although the operating speed is constant, it is possible to lower the speed of narrowing the relative distance between the surface of the semiconductor and the surface of the electrode. For this reason, it is unnecessary to accurately control the contacting operating. Therefore, the parallelism between the surface of the semiconductor and the surface of the electrode is adjusted by reducing the load on the semiconductor, so that it is possible to shorten the cycle time by increasing the operating speed.

(2) The parallelism adjusting device according to (1), wherein the pressing body includes a plurality of elastic bodies (for example, the later-described first pressing pins 31a and second pressing pins 31b) which are compressed to allow the surface of the electrode to be inclined so as to follow the inclination of the surface of the semiconductor when the surface of the semiconductor and the surface of the electrode are in contact with each other, wherein a portion (for example, the later-described first pressing pins 31a) of the elastic bodies are in contact with the electrode to press the electrode by the predetermined pressing force before the surface of the semiconductor and the surface of the electrode are in contact with each other, and wherein the others (for example, the later-described second pressing pins 31b) of the elastic bodies are in contact with the electrode to press the electrode with a pressing force which is stronger than the predetermined pressing force after the surface of the semiconductor and the surface of the electrode are in contact with each other.

According to the invention (2), a portion of the elastic bodies are in contact with the electrode to press the electrode with the predetermined pressing force before the surface of the semiconductor and the surface of the electrode come in contact with each other, and the others of the elastic bodies are in contact with the electrode to press the electrode with the pressing force which is stronger than the predetermined pressing force after the surface of the semiconductor and the surface of the electrode are in contact with each other. Accordingly, the adjustment of the parallelism between the surface of the semiconductor and the surface of the electrode is performed with the predetermined pressing force of the portions of the elastic bodies. In addition, the application of currents after the adjustment of the parallelism is performed by pressing the electrode with the pressing force of the plurality of elastic bodies including the portion of the elastic bodies, which is stronger than the predetermined pressing force.

(3) The parallelism adjusting device according to (2), wherein the surface of the electrode has a quadrangular shape, and wherein the portion of the elastic bodies are arranged in a distributive way corresponding to the four corners of the surface of the electrode.

According to the invention (3), a portion of the elastic bodies are arranged in a distributive way corresponding to the four corners of the surface of the electrode. Accordingly, a portion of the elastic bodies which are arranged in a distributive way corresponding to the four corners of the surface of the electrode exert a predetermined pressing force on the electrode with balance, so that the adjustment of the parallelism between the surface of the electrode and the surface of the semiconductor can be easily performed.

(4) The parallelism adjusting device according to any one of (1) to (3), also including an elastic supporting body (for example, the later-described elastic supporting body assembly 220) which elastically supports the semiconductor.

According to the invention (4), the elastic supporting body elastically supports the semiconductor. Accordingly, in the case when the surface of the semiconductor and the surface of the electrode are in contact with each other, the impact on the semiconductor is absorbed by the elastic supporting body, and thus, the load on the semiconductor is further reduced so that the resistance of the semiconductor to the impact weight is improved. Therefore, the cycle time can be shortened by further increasing the operating speed.

(5) A parallelism adjusting method for adjusting the parallelism between the surface (for example, a surface 100f) of a semiconductor (for example, a power semiconductor 100) and the surface (for example, a surface 21f) of an electrode (for example, a contact body 2) which is in contact with the surface of the semiconductor to press the surface and apply a current, the parallelism adjusting method including: narrowing the relative distance between the surface of the semiconductor and the surface of the electrode until portions of the two surfaces are in contact with each other (for example, the later-described Steps S1 and S2); allowing the surface of the electrode to be inclined so as to follow the inclination of the surface of the semiconductor while narrowing the relative distance (for example, the later-described Step S3); and pressing the surface of the electrode on the surface of the semiconductor (for example, the later-described Step S4), wherein, while allowing the surface of the electrode to be inclined, the surface of the electrode is pressed on the surface of the semiconductor with a predetermined pressing force, and wherein, in the pressing of the surface of the electrode on the surface of the semiconductor, the surface of the electrode is pressed on the surface of the semiconductor with a pressing force which is stronger than the predetermined pressing force.

According to the invention (5), it is possible to obtain the same functions and effects as those of the invention (1).

(6) The parallelism adjusting method according to (5), wherein, in the narrowing of the relative distance, the relative distance is narrowed at a predetermined speed, and wherein, while allowing the surface of the electrode to be inclined, the relative distance is narrowed at a speed which is lower than the predetermined speed.

According to the invention (6), in the narrowing of the relative distance, the relative distance is narrowed at a predetermined speed which is equal to the operating speed. While allowing the surface of the electrode to be inclined, the surface of the electrode pressed by a predetermined pressing force recedes from the surface of the semiconductor, and thus, the movement of the surface of the electrode becomes slow in comparison with the operating speed, so that the relative distance is narrowed at a speed which is lower than a predetermined speed.

According to the present invention, it is possible to provide a parallelism adjusting device and a parallelism adjusting method that is capable of adjusting the parallelism between the surface of a semiconductor and the surface of an electrode by reducing the load on the semiconductor and that is capable of shortening the cycle time by increasing the operating speed.

BRIEF DESCRIPTION OF THE DRAWINGS

FIG. 1A is an exploded view, and FIG. 1B is an overall view. FIGS. 4A to 4E are state diagrams 1 illustrating states of the processes of semiconductor inspection using the probe device according to the embodiment, FIGS. 5A to 5D are state diagrams 2 illustrating states of the processes of semiconductor inspection using the probe device according to the embodiment.

DETAILED DESCRIPTION OF THE INVENTION

Hereinafter, embodiments of the present invention will be described.

First Embodiment

Figures 1A, 1B:
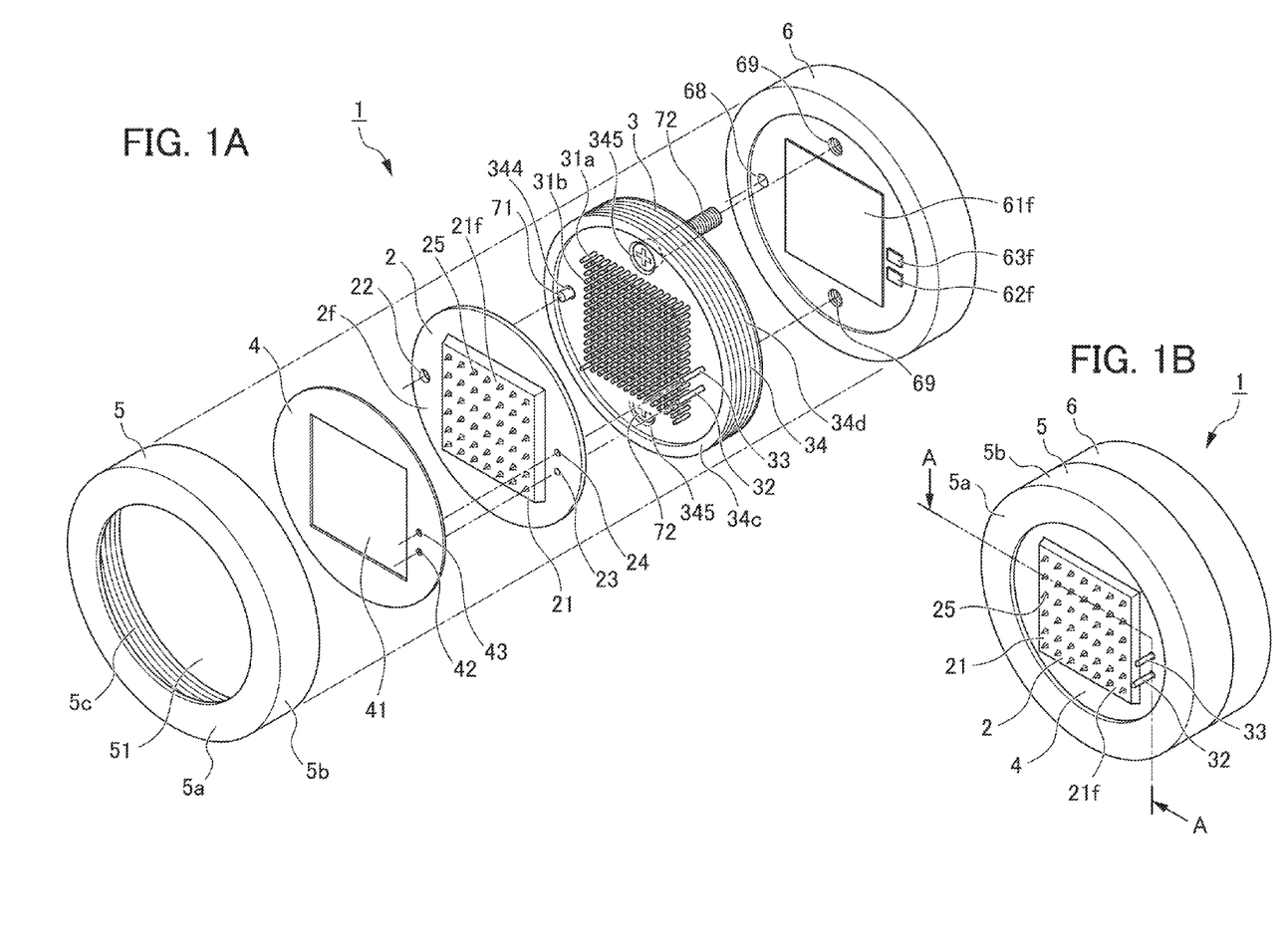
FIGS. 1A and 1B are perspective views illustrating a schematic configuration of a probe device according to an embodiment of the present invention.
Figure 2:
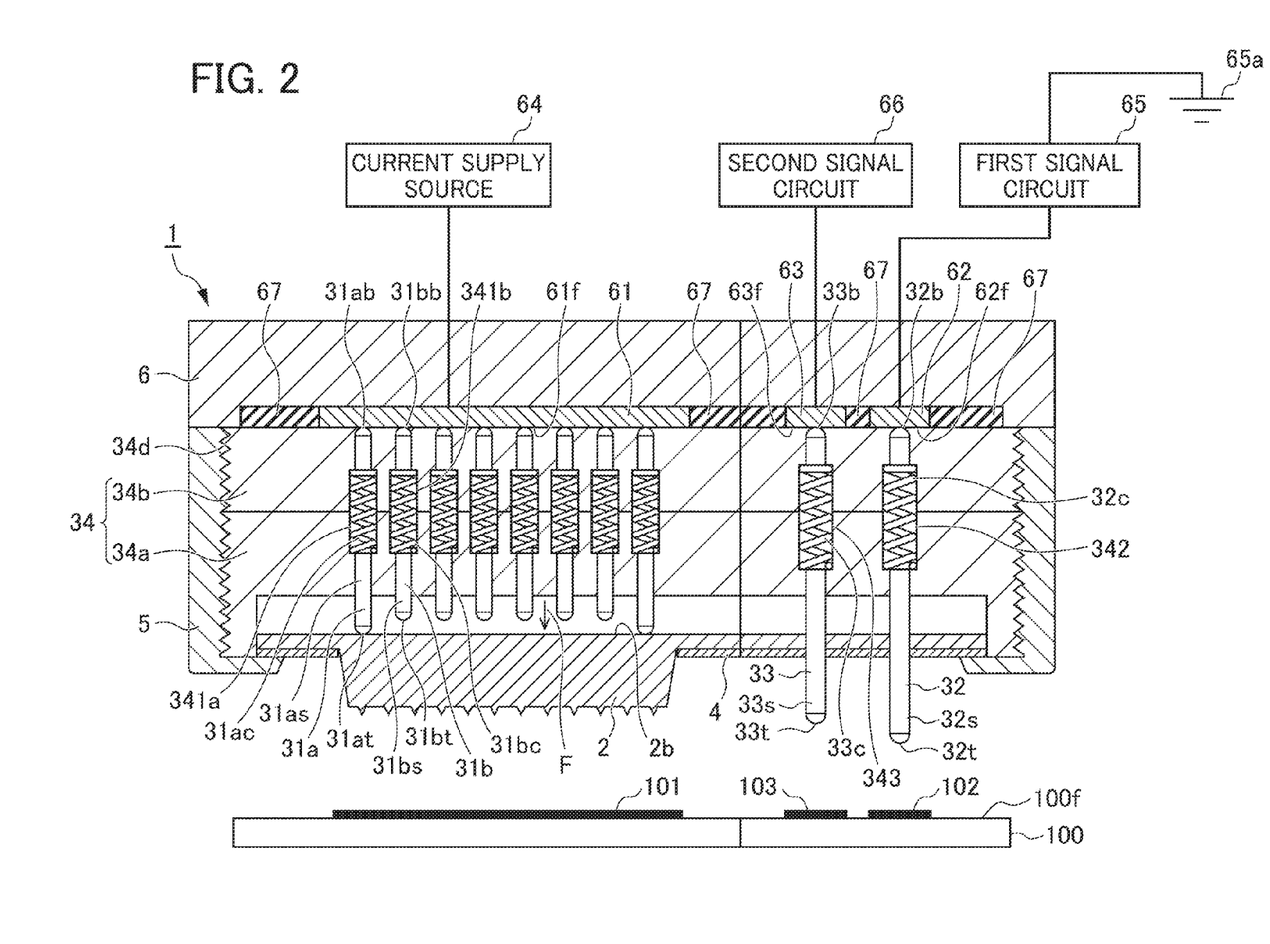
FIG. 2 is a cross-sectional view of the probe device according to the embodiment taken along line A-A of FIG. 1B.

FIGS. 1A and 1B are perspective views illustrating a schematic configuration of a probe device 1 as a current applying device according to a first embodiment of the present invention, FIG. 1A is an exploded view, and FIG. 1B is an overall view. FIG. 2 is a cross-sectional view of the probe device 1 according to the embodiment taken along line A-A of FIG. 1B. In the cross section taken along line A-A of FIG. 1A, the cutting direction is changed in mid-course in order to make the configuration of the cross section of the probe device 1 easily understood.

The probe device 1 illustrated in FIGS. 1A and 1B is employed in a semiconductor inspection apparatus for inspecting power semiconductors (IGBT, MOS, diodes, and the like) 100 used for switching a large current of from 400 A to 2000 A. The probe device 1 applies the large current to the power semiconductor 100 while pressing the power semiconductor 100.

The probe device 1 is configured to include a contact body 2, a pressing body assembly 3, an insulating plate 4, a fixing cover 5, and a substrate 6.

As illustrated in FIGS. 1A and 1B, the contact body 2 is disc-shaped and has a quadrangular contact portion 21 which is smaller than the quadrangular power semiconductor 100 at the center and is formed to project toward the power semiconductor 100 side. The contact body 2 is made of nickel.

The contact body 2 has one positioning hole 22 which a positioning rod 71 passes through in the thickness direction so as to be inserted into it, in the vicinity of the contact portion 21. In addition, a diameter of the positioning hole 22 of the contact body 2 is larger than the outer diameter of the positioning rod 71 so as to have a predetermined gap, and however, adjustment of the parallelism between the surface 21f of the contact portion 21 of the contact body 2 and the surface 100f of the power semiconductor 100 described later is not regulated.

The contact body 2 has two holes of a first signal-pin hole 23 and a second signal-pin hole 24, which a first signal pin 32 and a second signal pin 33 pass through in the thickness direction so as to be inserted into them, at the side of the contact portion 21 opposite to the positioning hole 22.

The contact portion 21 has a surface 21f which is to be in surface-contact with the power semiconductor 100. The surface 21f has a plurality of microscopic projections 25 which are inserted into only the surface electrode layer of surface layers of the power semiconductor 100. Although the contact portion 21 has the plurality of microscopic projections 25, the surface 21f is a flat surface that is large in comparison to the plurality of microscopic projections 25.

The plurality of microscopic projections 25 are formed by electroforming to have a height which is smaller than the thickness of about 10 μm of the surface electrode layer of the power semiconductor 100 and larger than the thickness of about 0.1 μm of the oxide layer formed on the surface of the surface electrode layer.

As illustrated in FIG. 2, the pressing body assembly 3 is configured to include four first pressing pins 31a, a plurality of second pressing pins 31b, a first signal pin 32, a second signal pin 33, and a case 34.

The pressing body assembly 3 is configured to incline the surface 21f of the contact portion 21 of the contact body 2 so as to follow the inclination of the surface 100f of the power semiconductor 100 and to press the contact body 2 on to the power semiconductor 100 so as to be electrified when the surface 100f of the power semiconductor 100 and the surface 21f of the contact portion 21 of the contact body 2 are in contact with each other.

In addition, the four first pressing pins 31a and the plurality of second pressing pins 31b are configured to press the surface 21f of the contact portion 21 of the contact body 2 in a manner that the surface 21f of the contact portion 21 of the contact body 2 can be inclined so as to follow the inclination of the surface 100f of the power semiconductor 100 when the surface 100f of the power semiconductor 100 and the surface 21f of the contact portion 21 of the contact body 2 are in contact with each other.

Each of the four first pressing pins 31a has a rod shape and is conductive. Front and posterior extremities 31at and 31ab of each of the four first pressing pins 31a are formed to have a hemispherical shape so as to reduce frictional resistance. The central region of each of the four first pressing pins 31a has a spring portion 31ac which elastically rebounds. The outer diameter of the spring portion 31ac of the first pressing pin 31a is larger than the outer diameters of the rod-shaped extremity portion 31as and posterior extremity portion excluding the spring portion 31ac of the first pressing pin 31.

The first pressing pins 31a are in contact with the back surface 2b of the contact body 2 by the extremities 31at projecting from the case 34, and the contact positions can be moved. The first pressing pins 31a are arranged at positions corresponding to the four corners of the contact portion 21 on the back surface 2b of the contact body 2 and exert a pressing force F on the four corners of the contact portion 21 of the contact body 2.

The first pressing pins 31a are in contact with the surface 61f of a pressing-pin electrode 61 of the substrate 6 by the posterior extremities 31ab projecting from the case 34, and a second current can flow into the first pressing pins 31a from the pressing-pin electrode 61 of the substrate 6.

Each of the second pressing pins 31b has the same configuration as that of the first pressing pin 31a. The rod-shaped extremity portion 31bs of the second pressing pin 31*b* at the extremity side of the spring portion 31*bc* is shorter than the rod-shaped extremity portion 31*as* of the first pressing pin 31*a*.

The second pressing pins 31*b* can be in contact with the back surface 2*b* of the contact body 2 by the extremity 31*bt* projecting from the case 34, and the contact positions can be moved. The second pressing pins 31*b* are arranged in the planar direction at equal intervals on the back surface 2*b* of the contact body 2 of which corner portions correspond to the four first pressing pins 31*a* and exert a pressing force F on a plurality of sections of the contact body 2.

The second pressing pins 31*b* are in contact with the surface 61*f* of the pressing-pin electrode 61 of the substrate 6 by the posterior extremities 31*bb* projecting from the case 34, and the second current can flow from the pressing-pin electrode 61 of the substrate 6.

The contact body 2 allows the back surface 2*b* to be in contact with the extremities 31*at* of the four first pressing pins 31*a* corresponding to the four corners of the contact portion 21 and is pressed with a predetermined pressing force by the four first pressing pins 31*a*. On the other hand, the contact body 2 has a gap between the back surface 2*b* and the extremities 31*bt* of the plurality of second pressing pins 31*b*, and thus, the back surface 2*b* and the extremities 31*bt* are not in contact with each other.

The first signal pin 32 has a rod shape and is conductive. The front and posterior extremities 32*t* and 32*b* of the first signal pin 32 are formed to have a hemispherical shape so as to reduce frictional resistance. A central region of the first signal pin 32 has a spring portion 32*c* which elastically rebounds. The outer diameter of the spring portion 32*c* of the first signal pin 32 is larger than the outer diameters of the rod-shaped extremity portion 32*s* and the posterior extremity portion of the first signal pin 32 excluding the spring portion 32*c* of the first signal pin 32. The first signal pin 32 is configured so that the rod-shaped extremity portion 32*s* at the front side of the spring portion 32*c* is longer than each of the rod-shaped extremity portions 31*as* of the pressing pins 31.

The first signal pin 32 inputs a first current for the emitter of the power semiconductor 100 into the power semiconductor 100.

The first signal pin 32 is in contact with the surface 100*f* of the power semiconductor 100 by the extremity 32*t* projecting from the case 34, and the contact position can be moved.

The first signal pin 32 is in contact with the surface 62*f* of the first signal-pin electrode 62 of the substrate 6 by the posterior extremity 32*b* projecting from the case 34 and can transfer an electrical signal of the first signal-pin electrode 62 of the substrate 6.

The second signal pin 33 has a rod shape and is conductive. The front and posterior extremities 33*t* and 33*b* of the second signal pin 33 are formed to have a hemispherical shape so as to reduce frictional resistance. The central region of the second signal pin 33 has a spring portion 33*c* which elastically rebounds. The outer diameter of the spring portion 33*c* of the second signal pin 33 is larger than the outer diameters of the rod-shaped extremity portion 33*s* and posterior extremity portion of the second signal pin 33 excluding the spring portion 33*c* of the second signal pin 33. The rod-shaped extremity portion 33*s* of the second signal pin 33 at the extremity side of the spring portion 33*c* is longer than the rod-shaped extremity portion 31*as* of the first pressing pin 31*a* and is shorter than the rod-shaped extremity portion 32*s* of the first signal pin 32.

The second signal pin 33 inputs a control signal for the gate of the power semiconductor 100 for controlling "on" and "off" of the power semiconductor 100 into the power semiconductor 100.

The second signal pin 33 is in contact with the surface 100*f* of the power semiconductor 100 by the extremity 33*t* projecting from the case 34, and the contact position can be moved.

The second signal pin 33 is in contact with the surface 63*f* of the second signal-pin electrode 63 of the substrate 6 by the posterior extremity 33*b* projecting from the case 34 and can transfer an electrical signal of the second signal-pin electrode 63 of the substrate 6.

As illustrated in FIG. 2, in the probe device 1, the extremity 32*t* of the first signal pin 32 projects most, the extremity 33*t* of the second signal pin 33 projects next to the extremity 32*t* of first signal pin 32, and the surface 21*f* of the contact portion 21 of the contact body 2 projects next to the extremity 33*t* of the second signal pin 33.

As illustrated in FIG. 2, the case 34 is configured to include a pair of circular plate members, that is, two case members 34*a* and 34*b* and has four first pressing-pin holes 341*a*, a plurality of second pressing-pin holes 341*b*, a first signal-pin hole 342, and a second signal-pin hole 343.

The four first pressing pins 31*a*, the plurality of second pressing pins 31*b*, the first signal pin 32, and the second signal pin 33 constitute the pressing body assembly 3 by arranging the spring portions 31*ac*, 31*bc*, 32*c*, and 33*c* of the pins 31*a*, 31*b*, 32, and 33 on the case member 34*a* which is one of the two divided members of the case 34 so as to be accommodated into cavity portions for spring portions of the holes 341*a*, 341*b*, 342, and 343 in the case member 34*a* and by integrating the two case members 34*a* and 34*b*.

As illustrated in FIGS. 1A and 1B, the case 34 has one positioning hole 344, which the positioning rod 71 passes through in the thickness direction so as to be inserted into it, and two fastening holes 345, which fastening bolts 72 pass through in the thickness direction so as to be inserted into them, in the vicinity of the plurality of second pressing-pin holes 341*b*. The fastening holes 345 have accommodating portions for accommodating the heads of the fastening bolts 72, and the two fastening holes 345 are arranged on a straight line penetrating through the center of the case 34 to be separated by the plurality of second pressing-pin holes 341*b*.

The case 34 has an annular convex portion 34*c* projecting toward the power semiconductor 100 side on the surface at the extremity side so as to guide the outer periphery of the contact body 2. The annular convex portion 34*c* can accommodate the contact body 2 in the internal side, so that the inner peripheral surface thereof smoothly regulates the movement of the contact body 2.

The case 34 has a threaded portion 34*d* on the outer peripheral surface thereof.

As illustrated in FIG. 2, the four first pressing-pin holes 341*a* are arranged at positions corresponding to the four corners of the contact portion 21 of the contact body 2. The first pressing pins 31*a* are arranged in the four first pressing-pin holes 341*a* to pass through in the thickness direction of the case 34. Namely, the central regions of the first pressing-pin holes 341*a* are formed as cavity portions of which the inner diameter is larger than other portions so as to be fitted to the size of the spring portions 31*ac* of the first pressing pins 31*a*, and the first pressing pins 31*a* are arranged in the first pressing-pin holes 341*a* by accommodating the spring portions 31*ac* of the first pressing pins 31*a* in the cavity portions. The first pressing pins 31*a* accommodated in the first pressing-pin holes 341 allow the extremities 31at and the posterior extremities 31ab to project at the outer side of the case 34 by the rod-shaped extremity portions 31as and the posterior extremity portions inserted into the first pressing-pin holes 341a. Preferably, the inner surface of each of the four first pressing-pin holes 341a is formed to have a smooth surface so that the first pressing pins 31a can smoothly move inside the first pressing-pin holes 341a.

Each of the second pressing-pin holes 341b has the same configuration as that of each of the first pressing-pin holes 341a.

Herein, the first pressing pins 31a are interchangeable with the second pressing pins 31b, and instead of the second pressing pins 31b, the first pressing pins 31a can be arranged in the second pressing-pin holes 341b. For example, each of the groups including the plurality of first pressing pins 31a may be arranged in positions corresponding to each of the four corners of the contact portion 21 of the contact body 2. In addition, the plurality of first pressing pins 31a may be arranged along the periphery of the contact portion 21 of the contact body 2 or may be arranged in an annular shape to be separated at equal distances from the center. Besides, the plurality of first pressing pins 31a may be arranged to be well balanced so as to uniformly distribute the pressing force over the contact body 2. According to this, by increasing the number of first pressing pins 31a, the pressing force (predetermined pressing force) of the plurality of first pressing pins 31a can be increased. Therefore, in a parallelism adjusting process, the predetermined pressing force at the time of adjusting the parallelism can be easily adjusted only by replacement of the first pressing pins 31a and the second pressing pins 31b.

A first signal-pin hole 342 is formed at one position in the adjacent area of the plurality of second pressing-pin holes 341b. A first signal pin 32 is arranged in the first signal-pin hole 342 to pass through in the thickness direction of the case 34. Namely, the central region of the first signal-pin hole 342 is formed as a cavity portion of which the inner diameter is larger than other portions so as to be fitted to the size of the spring portion 32c of the first signal pin 32, and the first signal pin 32 is arranged in the first signal-pin hole 342 by accommodating the spring portion 32c of the first signal pin 32 in the cavity portion. The first signal pin 32 accommodated in the first signal-pin hole 342 allows the extremity 32t and the posterior extremity 32b to project at the outer side of the case 34 by the rod-shaped extremity portion 32s and the posterior extremity portion inserted into the first signal-pin hole 342. Preferably, the inner surface of each of the first signal-pin holes 342 is formed to have a smooth surface so that the first signal pin 32 can move smoothly inside the first signal-pin hole 342.

The second signal-pin hole 343 is formed together with the first signal-pin hole 342 at one position in the adjacent area of the plurality of second pressing-pin holes 341b. The second signal-pin hole 343 has the same configuration as that of the first signal-pin hole 342.

As illustrated in FIGS. 1A and 1B, the insulating plate 4 is disc-shaped and is configured by an insulating member, and when the probe device 1 is assembled, the insulating plate 4 is located at the extremity of the probe device 1.

The insulating plate 4 has an opening 41 at the central region thereof. The insulating plate 4 covers the surface 2f of the peripheral edge of the contact portion 21 of the contact body 2 and allows the contact portion 21 of the contact body 2 to pass through the opening 41 and to project toward the power semiconductor 100 side.

The insulating plate 4 has a first signal-pin hole 42 and a second signal-pin hole 43, which the first signal pin 32 and the second signal pin 33 are inserted into, in the vicinity of the opening 41.

As illustrated in FIGS. 1A and 1B, the fixing cover 5 is an annular member and has a ring portion 5a and cylindrical portion 5b. The ring portion 5a has an opening 51, the diameter of which is smaller than the outer diameter of the insulating plate 4 and larger than that of the opening 41 of the insulating plate 4, inside the ring portion 5a. The cylindrical portion 5b extends in the direction from the ring portion 5a to the substrate 6 and has a threaded portion 5c on the inner peripheral surface thereof. The threaded portion 5c formed on the inner peripheral surface of the cylindrical portion 5b of the fixing cover 5 is engaged with the threaded portion 34d formed on the outer peripheral surface of the case 34 of the pressing body assembly 3.

As illustrated in FIG. 2, the substrate 6 is disc-shaped having the same diameter as that of the fixing cover 5. The substrate 6 includes a pressing-pin electrode 61, a first signal-pin electrode 62, and a second signal-pin electrode 63.

The pressing-pin electrode 61 is formed in the range where the posterior extremities 31ab of the four first pressing pins 31a and the posterior extremities 31bb of the plurality of second pressing pins 31b project and is connected to a current supply source 64 for the second current. A surface 61f of the pressing-pin electrode 61 is formed to have a smooth surface, and when the probe device 1 is assembled, the surface 61f is in contact with the posterior extremities 31ab and 31bb.

The first signal-pin electrode 62 is formed at the position where the posterior extremity 32b of the first signal pin 32 projects to supply the first current and to be connected to a grounded first signal circuit 65 connected to a grounded portion 65a. The surface 62f of the first signal-pin electrode 62 is formed to have a smooth surface, and when the probe device 1 is assembled, the surface 62f is in contact with the posterior extremity 32b of the first signal pin 32.

The second signal-pin electrode 63 is formed at the position where the posterior extremity 33b of the second signal pin 33 projects to be connected to a second signal circuit 66 for supplying a control signal. The surface 63f of the second signal-pin electrode 63 is formed to have a smooth surface, and when the probe device 1 is assembled, the surface 63f is in contact with the posterior extremity 33b of the second signal pin 33.

The pressing-pin electrode 61, the first signal-pin electrode 62, and the second signal-pin electrode 63 are separated by an insulating member 67 inside the substrate 6 so as not to be electrically conductive with each other.

As illustrated in FIGS. 1A and 1B, the substrate 6 has one positioning hole 68 which the positioning rod 71 is inserted into, and two fastening holes 69 which the fastening bolts 72 are fastened to. The fastening holes 69 are configured as threaded holes which are engaged with the threaded portions of the fastening bolts 72.

The probe device 1 can be assembled by installing the fixing cover 5 by using the one positioning rod 71 and the two fastening bolts 72.

More specifically, the pressing body assembly 3 is located on the substrate 6, and the positioning rod 71 is inserted into the positioning hole 344 of the pressing body assembly 3 and also into the positioning hole 68 of the substrate 6. In addition, the fastening bolts 72 are inserted into the fastening holes 345 of the pressing body assembly 3 and also into the fastening holes 69 of the substrate 6. Therefore, the positional relationship between the substrate 6 and the pressing body assembly 3 is defined.

Next, the pressing body assembly 3 is fixed to the substrate 6 by engaging the fastening bolts 72 with the fastening holes 69 of the substrate 6. In this state, the extremity of the positioning rod 71 projects from the surface of the pressing body assembly 3. The projecting extremity of the positioning rod 71 is inserted into the positioning hole 22 of the contact body 2, and the contact body 2 is disposed inside the annular convex portion 34c of the case 34 so that the contact body 2 is smoothly positioned. At this time, the back surface 2b of the contact body 2 is in contact with the projecting extremities 31at of the four first pressing pins 31a of the pressing body assembly 3, but the back surface 2b is not in contact with the extremities 31bt of the plurality of second pressing pins 31b. Even in the state where the contact body 2 is positioned, the contact body 2 can be moved.

Next, the contact body 2 is covered with the insulating plate 4, and in this state the fixing cover 5 is fixed to the pressing body assembly 3 by engaging the threaded portion 5c formed on the inner peripheral surface of the cylindrical portion 5b of the fixing cover 5 with the threaded portion 34d formed on the outer peripheral surface of the pressing body assembly 3. At this time, the surface 2f of the contact body 2 is pressed on the ring portion 5a of the fixing cover 5 in the direction toward the substrate 6, and the back surface 2b of the contact body 2 is pressed from the extremities 31at of the four first pressing pins 31a in the reverse direction of the pressing direction of the fixing cover 5.

In addition, in the semiconductor inspection, the contact body 2 is destroyed when an abnormality of the power semiconductor 100 is detected. Therefore, the replacement frequency of the contact body 2 is different to that of other parts. In the probe device 1, the contact body 2 can be replaced by loosening the threaded portion 5c of the inner peripheral surface of the cylindrical portion 5b of the fixing cover 5 from the threaded portion 34d formed on the outer peripheral surface of the pressing body assembly 3 and only by removing the fixing cover 5 in the reverse of the assembly of the probe device 1 described above.

Next, the power semiconductor 100 will be described. The power semiconductor 100 is an IGBT, a MOS, a diode, or the like used for switching a large current of from 400 A to 2000 A. The power semiconductor 100 is arranged on a mounting table (not illustrated). The mounting table is connected to a cylinder (not illustrated), and the cylinder presses the power semiconductor 100 of the mounting table on to the probe device 1.

The power semiconductor 100 is formed in a quadrangular shape and has a contact body contact area 101, a first-signal-pin contact area 102, and a second-signal-pin contact area 103 on the internal side.

The contact body contact area 101 is formed in a range which the contact portion 21 of the contact body 2 is in contact with and serves as an emitter of the power semiconductor 100, so that the second current is input from the probe device 1 to the contact body contact area 101.

The first-signal-pin contact area 102 is in a range which the first signal pin 32 is in contact with and serves as an emitter of the power semiconductor 100, so that the first current is input from the probe device 1 to the first-signal-pin contact area 102.

The second-signal-pin contact area 103 is in a range which the second signal pin 33 is in contact with and serves as a gate of the power semiconductor 100, so that the control signal is input from the probe device 1 to the second-signal-pin contact area 103.

The power semiconductor 100 is configured to include a surface plating layer, a semiconductor layer, and a back surface plating layer.

The surface plating layer is configured with a gold layer, a nickel layer, and an aluminum layer. The gold layer and the nickel layer are insulated by an insulating material using polyimide, and thus, the contact body contact area 101 and the first-signal-pin contact area 102 are isolated from each other. On the other hand, the aluminum layer is not insulated by an insulating materials using polyimide, and thus, the contact body contact area 101 and the first-signal-pin contact area 102 are electrically connected to (conducting with) each other.

The semiconductor layer is a silicon layer. The semiconductor layer includes an emitter and a gate at the surface side and a collector at the back surface side.

The back surface plating layer is configured with a gold layer, a nickel layer, and an aluminum layer. The back surface plating layer has no insulating material using polyimide.

Next, inspection of the power semiconductor 100 using the probe device 1 will be described.

Figure 3:
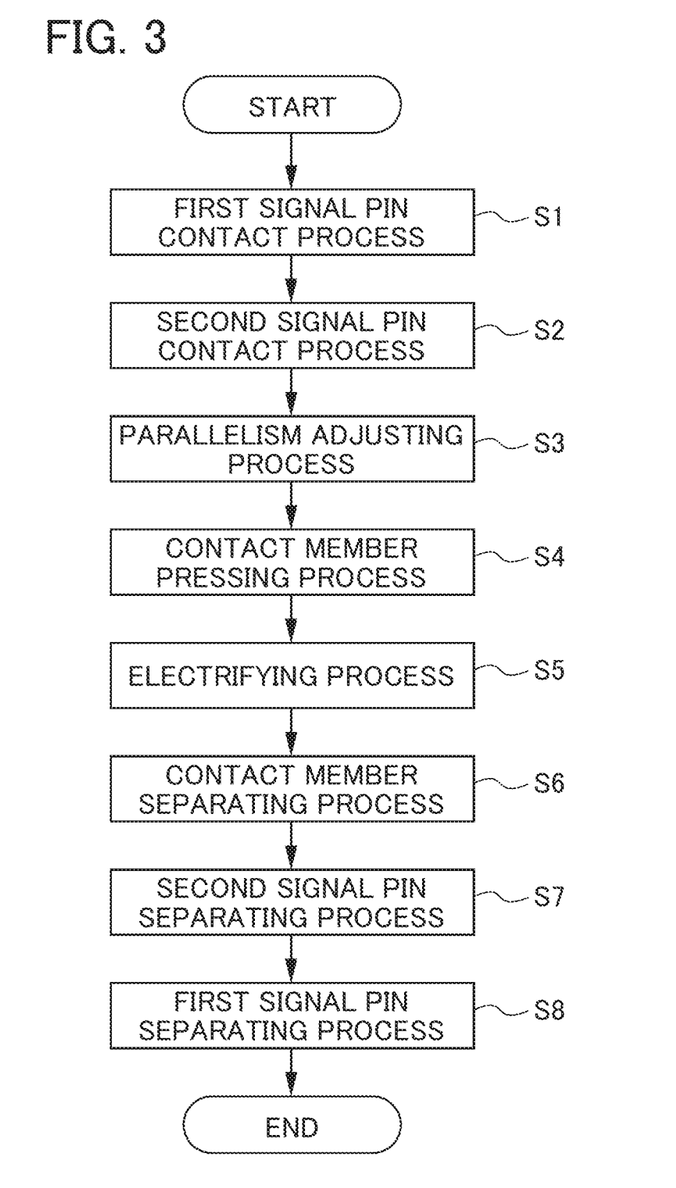
FIG. 3 is a flowchart illustrating processes of semiconductor inspection using the probe device according to the embodiment.

FIG. 3 is a flowchart illustrating the processes of semiconductor inspection using the probe device 1 according to the embodiment.

Figure 4A:
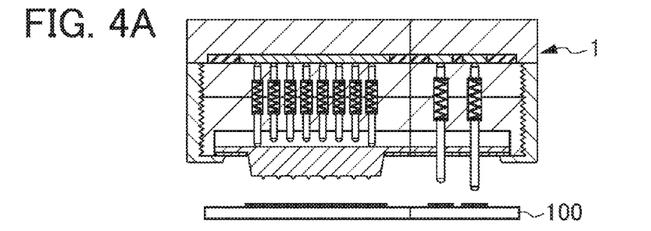
FIG. 4A is a state diagram illustrating a standby state.
Figure 4B:
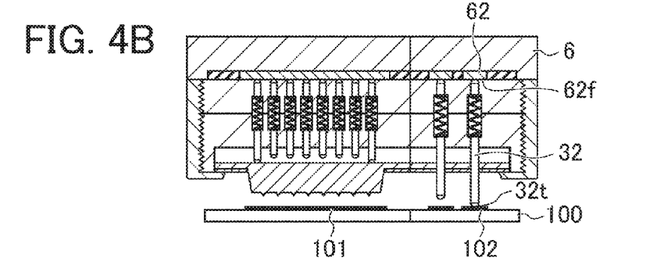
FIG. 4B is a state diagram illustrating a contact state between the first signal pin and a power semiconductor.
Figure 4C:
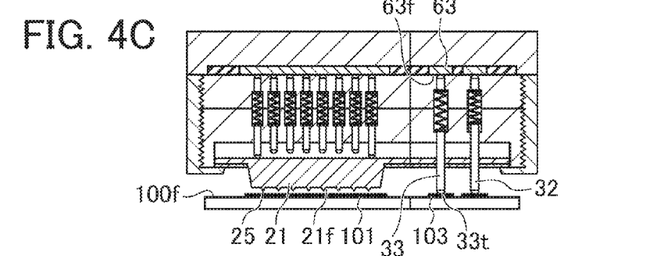
FIG. 4C is a state diagram illustrating a contact state between the second signal pin and the power semiconductor.
Figure 4D:
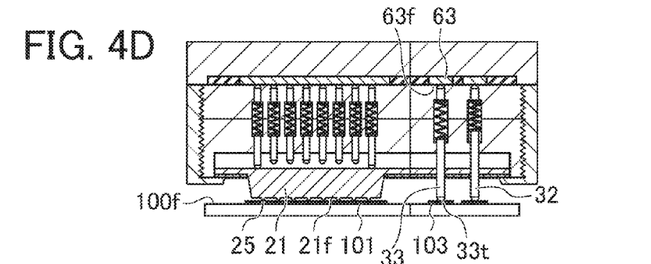
FIG. 4D is a state diagram illustrating a contact state between the contact body and the power semiconductor.
Figure 4E:
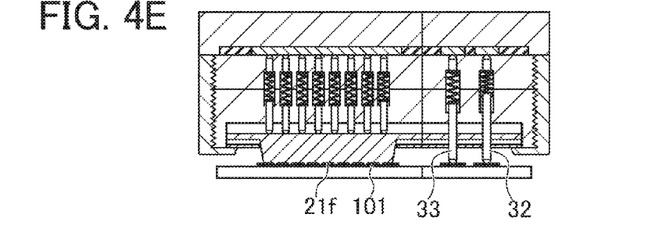
FIG. 4E is a state diagram illustrating the pressing state between the contact body and the power semiconductor.

FIGS. 4A to 4E are state diagrams 1 illustrating the states of the processes of semiconductor inspection using the probe device 1 according to the embodiment, FIG. 4A is a state diagram illustrating a standby state, FIG. 4B is a state diagram illustrating the contact state between the first signal pin 32 and the power semiconductor 100, FIG. 4C is a state diagram illustrating the contact state between the second signal pin 33 and the power semiconductor 100, FIG. 4D is a state diagram illustrating the contact state between the contact body 2 and the power semiconductor 100, and FIG. 4E is a state diagram illustrating the pressing state between the contact body 2 and the power semiconductor 100.

Figure 5A:
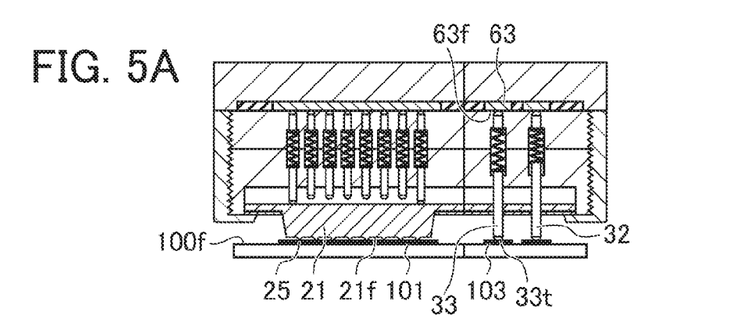
FIG. 5A is a state diagram illustrating the contact state between the contact body and the power semiconductor.
Figure 5B:
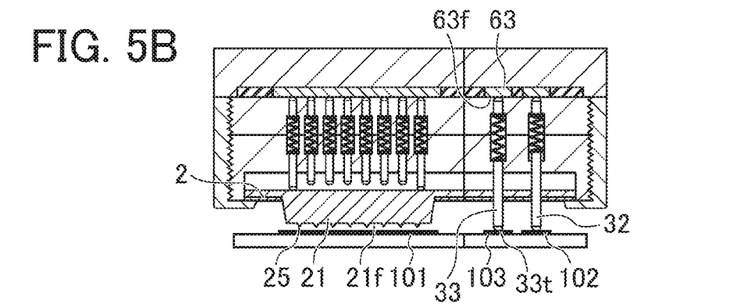
FIG. 5B is a state diagram illustrating the separation state between the contact body and the power semiconductor.
Figure 5C:
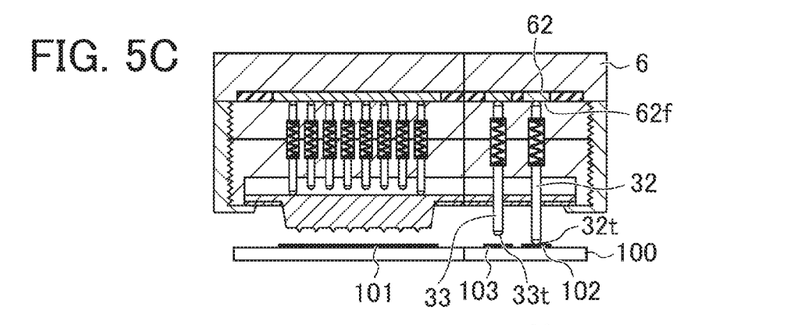
FIG. 5C is a state diagram illustrating the separation state between the second signal pin and the power semiconductor.
Figure 5D:
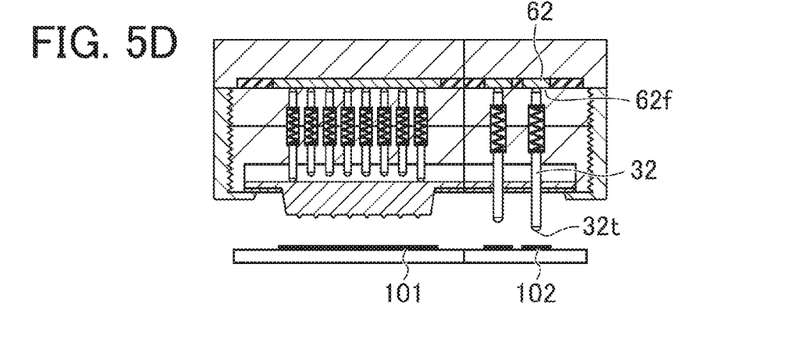
FIG. 5D is a state diagram illustrating the separation state between the first signal pin and the power semiconductor.

FIGS. 5A to 5D are state diagrams 2 illustrating the states of the processes of semiconductor inspection using the probe device 1 according to the embodiment, FIG. 5A is a state diagram illustrating the contact state between the contact body 2 and the power semiconductor 100, FIG. 5B is a state diagram illustrating the separation state between the contact body 2 and the power semiconductor 100, FIG. 5C is a state diagram illustrating the separation state between the second signal pin 33 and the power semiconductor 100, and FIG. 5D is a state diagram illustrating the separation state between the first signal pin 32 and the power semiconductor 100.

As illustrated in FIG. 4A, initially, the probe device 1 is in a standby state where the probe device 1 is separated from the power semiconductor 100.

When the inspection is started, first, the mounting table on which the power semiconductor 100 is mounted is moved forward in the direction toward the probe device 1 by the cylinder. The operating speed of the forward movement of the mounting table is constant.

As illustrated in FIG. 4B, in Step S1, due to the forward movement of the mounting table, the extremity 32t of the first signal pin 32 is in contact with the first-signal-pin contact area 102 of the power semiconductor 100 (first signal pin contact process).

The first signal circuit 65 connected to the first signal-pin electrode 62 is connected to the grounded portion 65a so as to be grounded. Therefore, when the extremity 32t of the first signal pin 32 is in contact with the first-signal-pin contact area 102 of the power semiconductor 100, residual electricity remaining in the first-signal-pin contact area 102 flows to the grounded portion 65a of the first signal circuit 65 so as to be removed. In addition, since the first-signal-pin contact area 102 is electrically connected to the contact body contact area 101 by the aluminum layer in the surface plating layer, residual electricity remaining in the contact body contact area 101 also flows to the grounded portion 65a of the first signal circuit 65 so as to be removed.

As illustrated in FIG. 4C, in Step S2, due to the forward movement of the mounting table, the extremity 33t of the second signal pin 33 is in contact with the second-signal-pin contact area 103 of the power semiconductor 100 (second signal pin contact process).

Herein, the second signal circuit 66, which is connected by allowing the second signal pin 33 to be in contact with the surface 63f of the second signal-pin electrode 63 of the substrate 6, applies the control signal, and the second signal circuit 66 is not grounded. For this reason, if the second signal pin 33 is in contact with the power semiconductor 100 at the same time as or prior to the first signal pin 32, there may be a problem in that adverse effects occur during the removal of residual electricity remaining in the contact body contact area 101 using the first signal pin 32. Therefore, the extremity 33t of the second signal pin 33 is configured so as not to project further than the extremity 32t of the first signal pin 32, so that the extremity 33t of the second signal pin 33 is in contact with the power semiconductor 100 after the extremity 32t of the first signal pin 32. In addition, in the case where the second signal pin 33 is configured to be in contact with the power semiconductor 100 prior to the surface 21f of the contact portion 21 of the contact body 2, the surface 21f of the contact portion 21 of the contact body 2 can be in contact with the power semiconductor 100 at last by taking into consideration the contact pressure of the second signal pin 33 on the power semiconductor 100, so that the parallelism of the contact body 2 with respect to the power semiconductor 100 can be easily adjusted.

As illustrated in FIG. 4D, in Step S3, due to the forward movement of the mounting table, a portion of the surface 21f of the contact portion 21 of the contact body 2 is in contact with the contact body contact area 101 of the power semiconductor 100, and the pressing force exerted by the four first pressing pins 31a is involved in this step (parallelism adjusting process).

More specifically, first, the plurality of microscopic projections 25 is inserted into only the surface electrode layer of the surface layers of the power semiconductor 100. Therefore, the plurality of microscopic projections 25 serves as spikes so that the position of the contact body 2 with respect to the power semiconductor 100 is defined.

When the power semiconductor 100 is further pressed on the probe device 1 by the cylinder, the contact body 2 is separated from the fixing cover 5, which leads to a floating state where the four corners of the contact portion 21 are pressed by the four first pressing pins 31a. In addition, just after a portion of the surface 100f of the power semiconductor 100 and a portion of the surface 21f of the contact portion 21 of the contact body 2 are in contact with each other, although the operating speed of the mounting table is constant, the surface 21f of the contact portion 21 of the contact body 2 pressed by a predetermined pressing force recedes from the surface 100f of the power semiconductor 100, so that the speed of narrowing the relative distance between the surface 100f of the power semiconductor 100 and the surface 21f of the contact portion 21 of the contact body 2 is lowered. Therefore, the contact body 2 is inclined so as to follow the inclination of the surface 100f of the power semiconductor 100 so that strongly-pressing first pressing pins 31a are contracted and weakly-pressing first pressing pins 31a exert the pressing force F. Therefore, each first pressing pin 31a balances between the pressing force F and the contraction. Accordingly, the four first pressing pins 31a adjust the parallelism between the contact body 2 and the surface 100f of the power semiconductor 100.

Particularly, the contact body 2 is a member the entire back surface 2b of which back surface is pressed on the four first pressing pins 31a and is finely rocked according to the behavior of the four first pressing pins 31a arranged according to the four corners of the contact portion 21 of the contact body 2 so that the parallelism between the contact body and the surface 100f of the power semiconductor 100 is adjusted.

As illustrated in FIG. 4E, in Step S4, due to the forward movement of the mounting table, the surface 21f of the contact portion 21 of the contact body 2 is in contact with the contact body contact area 101 of the power semiconductor 100, and the pressing force exerted by the four first pressing pins 31a and the plurality of second pressing pins 31b is involved in this step (contact body pressing process).

More specifically, the extremities 31bt of the plurality of second pressing pins 31b are in contact with the back surface 2b of the contact body 2 the parallelism of which parallelism is adjusted so that the contact pressure becomes uniform by the pressing force of the four first pressing pins 31a and the plurality of second pressing pins 31b. Therefore, the surface 21f of the contact portion 21 of the contact body 2 is uniformly in contact with the surface 100f of the power semiconductor 100 to press the surface 100f.

At this time, when the mounting table is pressed on the probe device 1 by the cylinder, horizontal displacement, torsion, vibration, or the like may occur in the mounting table. On the other hand, the first pressing pins 31a and the second pressing pins 31b have small frictional resistance because each of the extremities 31at and 31bt has a hemispherical shape, and the first pressing pins 31a and the second pressing pins 31b can absorb the horizontal displacement, torsion, vibration, or the like occurring in the mounting table as a displacement of the contact positions of the extremities 31at and 31bt which are in contact with the back surface 2b of the contact body 2. Therefore, since the contact state of the contact body 2 with respect to the surface 100f of the power semiconductor 100 is not influenced by the horizontal displacement, torsion, vibration, or the like, so that the plurality of microscopic projections 25 do not cut the surface 100f of the power semiconductor 100 as a result of the position displacement of the contact body 2.

The surface 21f of the contact portion 21 of the contact body 2 is a flat surface which is larger in comparison to the plurality of microscopic projections 25 and becomes a regulating surface which regulates the insertion of the plurality of microscopic projections 25 into the surface electrode layer. Therefore, even in the case when pressure is further exerted after the plurality of microscopic projections 25 are inserted into the surface electrode layer of the power semiconductor 100, the surface 21f maintains the contact state with respect to the power semiconductor 100, and regulates the excessive insertion of the plurality of microscopic projections 25 into the surface electrode layer.

In Step S5, the inspection of the power semiconductor 100 is performed by allowing the current supply source 64 at the back of the substrate 6 to supply the second current as a large current to the contact body 2 through the four first pressing pins 31a and the plurality of second pressing pins 31b, allowing the first signal circuit 65 at the back of the substrate 6 to supply the first current to the first signal pin 32, and allowing the second signal circuit 66 at the back of the substrate 6 to input the control signal for controlling "on" and "off" of the power semiconductor 100 to the second signal pin 33 (electrifying process).

After the inspection is performed, the mounting table is moved backward in the direction opposite to the probe device 1 by the cylinder. The operating speed of the backward movement of the mounting table is constant.

As illustrated in FIGS. 5A and 5B, in Step S6, due to the backward movement of the mounting table, the surface 21f of the contact portion 21 of the contact body 2 is separated from the contact body contact area 101 of the power semiconductor 100 (contact body separating process).

As illustrated in FIG. 5C, in Step S7, due to the backward movement of the mounting table, the extremity 33t of the second signal pin 33 is separated from the second-signal-pin contact area 103 of the power semiconductor 100 (second signal pin separating process).

Herein, the second signal circuit 66, which is connected to the second-signal-pin contact area 103, applies the control signal, and thus, the second signal circuit 66 is not grounded. For this reason, if the second signal pin 33 is separated from the power semiconductor 100 at the same time as or prior to the first signal pin 32, there may be a problem in that adverse effects occur in the removal of residual electricity remaining in the contact body contact area 101 using the first signal pin 32. Therefore, the extremity 33t of the second signal pin 33 is configured so as not to project further than the extremity 32t of the first signal pin 32, so that the extremity 33t of the second signal pin 33 is separated from the power semiconductor 100 prior to the extremity 32t of the first signal pin 32. In addition, in the case when the extremity 33t of the second signal pin 33 is configured to be separated from the power semiconductor 100 after the surface 21f of the contact portion 21 of the contact body 2, the contact body 2 can be separated from the power semiconductor 100 beforehand, and thus, the contact body 2 is not influenced by an impact or a change in contact pressure when the second signal pin 33 is separated, so that the plurality of microscopic projections 25 of the contact body 2 does not damage the surface 100f of the power semiconductor 100.

As illustrated in FIG. 5D, in Step S8, due to the backward movement of the mounting table, the extremity 32t of the first signal pin 32 is separated from the first-signal-pin contact area 102 of the power semiconductor 100 (first signal pin separating process).

Herein, the first signal circuit 65, which is connected to the first-signal-pin contact area 102, is connected to the grounded portion 65a to be grounded. For this reason, if the extremity 32t of the first signal pin 32 is finally separated from the first-signal-pin contact area 102 of the power semiconductor 100, the residual electricity remaining in the first-signal-pin contact area 102 and the contact body contact area 101 electrically connected to the first-signal-pin contact area 102 in the inspection can flow into the grounded portion 65a of the first signal circuit 65 to be finally removed.

Therefore, the probe device 1 returns to the standby state.

In the probe device 1 according to the embodiment above, it is possible to obtain the following effects.

(1) Unlike the embodiment in the case when the plurality of second pressing pins 31b is pressed on to the back surface 2b of the contact body 2 in the standby state of the probe device 1, if the surface 21f of the contact portion 21 of the contact body 2 and the surface 100f of the power semiconductor 100 are in contact with each other, weight is concentrated on the contact portion so that a large frictional force is generated. Therefore, there is a problem in that it is difficult for the contact body 2 to be inclined so as to follow the inclination of the surface of the power semiconductor 100, and it is difficult to adjust the parallelism.

In addition, unlike the embodiment, in the case when the four first pressing pins 31a are not pressed on to the back surface 2b of the contact body 2 in the standby state of the probe device 1, if the power semiconductor 100 rapidly pushes up to the contact body 2 at the time of contact, the four first pressing pins 31a and the plurality of second pressing pins 31b suffer an impact and become damaged. For this reason, there is a problem in that since the surface 21f of the contact portion 21 of the contact body 2 and the surface 100f of the power semiconductor 100 need to slowly come into contact with each other, the cycle time, that is, the inspection time per power semiconductor is prolonged.

On the other hand, in the embodiment, the pressing body assembly 3 presses the contact body 2 by the pressing force of the four first pressing pins 31a until the surface 100f of the power semiconductor 100 and the surface 21f of the contact portion 21 of the contact body 2 are in contact with each other to adjust the parallelism, and after that, the pressing body assembly 3 presses the contact body 2 by the pressing force of the four first pressing pins 31a and the plurality of second pressing pins 31b, which is stronger than the pressing force of the four first pressing pins 31a.

Namely, in the parallelism adjusting process, the surface 21f of the contact portion 21 of the contact body 2 is pressed on to the surface 100f of the power semiconductor 100 by the pressing force of the four first pressing pins 31a, and in the pressing process, the surface 21f of the contact portion 21 of the contact body 2 is pressed on to the surface 100f of the power semiconductor 100 by the pressing force of the four first pressing pins 31a and the plurality of second pressing pins 31b, which is stronger than the pressing force of the four first pressing pins 31a.

Accordingly, the adjustment of the parallelism between the surface 100f of the power semiconductor 100 and the surface 21f of the contact portion 21 of the contact body 2 is performed not by an excessive pressing force but by the pressing force of the four first pressing pins 31a. For this reason, the surface 21f of the contact portion 21 of the contact body 2 pressed by the pressing force of the four first pressing pins 31a can be easily inclined so as to follow the surface 100f of the power semiconductor 100. In addition, just after a portion of the surface 100f of the power semiconductor 100 and a portion of the surface 21f of the contact portion 21 of the contact body 2 are in contact with each other, although the operating speed of the mounting table is constant, the surface 21f of the contact portion 21 of the contact body 2 pressed by a predetermined pressing force recedes from the surface 100f of the power semiconductor 100, so that the speed of narrowing the relative distance between the surface 100f of the power semiconductor 100 and the surface 21f of the contact portion 21 of the contact body 2 is lowered. Therefore, the contact made between the surface 100f of the power semiconductor 100 and the surface 21f of the contact portion 21 of the contact body 2 is smoothly performed while the parallelism is adjusted.

In addition, the application of currents after the adjustment of the parallelism is performed by the pressing force of the four first pressing pins 31a and the plurality of second pressing pins 31b, which is stronger than the pressing force of the four first pressing pins 31a. For this reason, after the parallelism is adjusted, the contact body 2 is pressed by the pressing force of the four first pressing pins 31a and the plurality of second pressing pins 31b, which is stronger than the pressing force of the four first pressing pins 31a, so that the weight concentration on the power semiconductor 100 is minimized, and thus, the load is reduced. In addition, the current which needs to be applied while pressing can flow well from the contact body 2 into the power semiconductor 100.

In this manner, it is possible to reduce the load on the power semiconductor 100 and, although the operating speed of the mounting table is constant, it is possible to lower the speed of narrowing the relative distance between the surface 100f of the power semiconductor 100 and the surface 21f of the contact portion 21 of the contact body 2. For this reason, it is unnecessary to accurately control the contact operation. Therefore, the parallelism between the surface 100f of the power semiconductor 100 and the surface 21f of the contact portion 21 of the contact body 2 is adjusted by reducing the load on the power semiconductor 100, so that it is possible to shorten the cycle time by increasing the operating speed of the mounting table.

(2) The four first pressing pins 31a are in contact with the contact body 2 to press the contact body 2 with a predetermined pressing force before the surface 100f of the power semiconductor 100 and the surface 21f of the contact portion 21 of the contact body 2 come into contact with each other, and the plurality of second pressing pins 31b are in contact with the contact body 2 to press the contact body 2 with a pressing force stronger than the predetermined pressing force after the surface 100f of the power semiconductor 100 and the surface 21f of the contact portion 21 of the contact body 2 come into contact with each other. Accordingly, the adjustment of the parallelism between the surface 100f of the power semiconductor 100 and the surface 21f of the contact portion 21 of the contact body 2 is performed by a predetermined pressing force of the four first pressing pins 31a. In addition, the application of currents after the adjustment of the parallelism is performed while the contact body 2 is pressed by the pressing force of the four first pressing pins 31a and the plurality of second pressing pins 31b, which is stronger than predetermined the pressing force.

(3) The four first pressing pins 31a are arranged in a distributive way corresponding to the four corners of the surface 21f of the quadrangular contact portion 21 of the contact body 2. Accordingly, the four first pressing pins 31a which are arranged in a distributive way corresponding to the four corners of the surface 21f of the quadrangular contact portion 21 of the contact body 2 exert a predetermined pressing force on to the contact body 2 with balance, so that the adjustment of the parallelism between the surface 21f of the contact portion 21 of the contact body 2 and the surface 100f of the power semiconductor 100 can be easily performed.

(4) In Steps S1 and S2, the relative distance is narrowed at a predetermined speed which is equal to the operating speed of the mounting table. In Step S3, the surface 21f of the contact portion 21 of the contact body 2 pressed by a predetermined pressing forces of the four first pressing pins 31a recedes from the surface 100f of the power semiconductor 100, and thus, the movement of the surface 21f of the contact portion 21 of the contact body 2 becomes slow in comparison with the operating speed of the mounting table, so that the relative distance is narrowed at a speed which is lower than a predetermined speed.

Second Embodiment

Next, a second embodiment will be described. In the second embodiment, the configurations of the second embodiment are the same as those of the first embodiment except the configuration of the mounting table 200 on which the power semiconductor 100 is mounted, and thus, the description of the same confirmations will be omitted, and the feature portions will be described.

Figure 6:
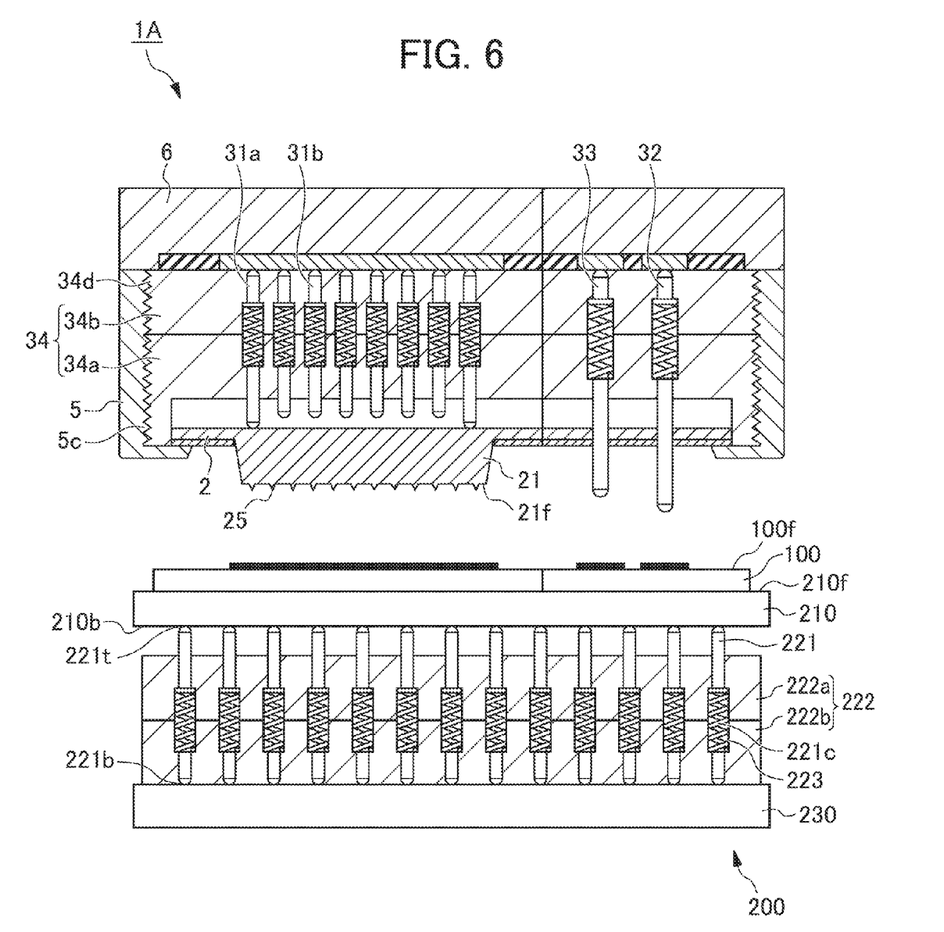
FIG. 6 is a cross-sectional view of a probe device according to a second embodiment taken along line A-A of FIG. 1B.

FIG. 6 is a cross-sectional view of a probe device 1A according to the embodiment taken along line A-A of FIG. 1B. In the cross section taken along line A-A of FIG. 1B, the cutting direction is changed in order to make the configuration of the cross section of the probe device 1A easily understood.

The mounting table 200 is configured to include a stage 210, an elastic supporting body assembly 220, and a base 230.

The stage 210 is a conductive plate member, and the power semiconductor 100 is mounted on the surface 210f thereof.

The elastic supporting body assembly 220 is configured to include a plurality of elastic supporting pins 221 and a case 222.

Each of the plurality of elastic supporting pins 221 has a rod shape and is conductive. A central region of each of the plurality of elastic supporting pins 221 has a spring portion 221c which elastically rebounds. The outer diameter of the spring portion 221c of the elastic supporting pin 221 is larger than the outer diameters of the rod-shaped extremity portion and posterior extremity portion of the elastic supporting pin 221 excluding the spring portion 221c of the elastic supporting pin 221.

The case 222 is configured to include a pair of two plate members, that is, case members 222a and 222b and has a plurality of elastic-supporting-pin holes 223.

The case 222 is fixed to the base 230 by bolts (not illustrated).

The plurality of elastic-supporting-pin holes 223 is arranged on the lower surface of the stage 210 in the planar direction at equal intervals. The elastic supporting pins 221 are arranged in the plurality of elastic-supporting-pin holes 223 to pass through in the thickness direction of the case 222. Namely, the central regions of the elastic-supporting-pin holes 223 are formed as cavity portions the inner diameter of which is larger than other portions so as to be fitted to the size of the spring portion 221c of the elastic supporting pins 221, and the elastic supporting pins 221 are arranged in the elastic-supporting-pin holes 223 by accommodating the spring portions 221c of the elastic supporting pins 221 in the cavity portions. The elastic supporting pins 221 accommodated in the elastic-supporting-pin holes 223 allow the front and posterior extremities 221t and 221b to project at the outer side of the case 222 by the rod-shaped extremity portions and the posterior extremity portions inserted into the elastic-supporting-pin holes 223. Preferably, the inner surface of each of the plurality of elastic-supporting-pin holes 223 is formed to have a smooth surface so that the elastic supporting pins 221 can smoothly move inside the elastic-supporting-pin holes 223.

The elastic supporting pins 221 can be in contact with the lower surface 210b of the stage 210 by the extremities 221t projecting from the case 222. The elastic supporting pins 221 are arranged in the planar direction at equal intervals in the area of the stage 210 on which the power semiconductor 100 is mounted, and a plurality of sections of the lower surface 210b of the stage 210 can be elastically supported by a predetermined pressing force.

The elastic supporting pins 221 are in contact with the surface of an elastic-supporting-pin electrode (not illustrated) of the base 230 by the posterior extremity 221b projecting from the case 222, and a current can flow from the elastic-supporting-pin electrode of the base 230.

In the case where the surface 21*f* of the contact portion 21 of the contact body 2 is in contact with the contact body contact area of the power semiconductor 100, the mounting table 200 absorbs impacts to the power semiconductor 100 due to the contraction of the elastic supporting pins 221. For this reason, weight concentration on the power semiconductor 100 is alleviated, so that the load is further reduced.

In the probe device 1A according to the embodiment above, it is possible to obtain the following effect as well as the effects (1) to (4) of the above-described embodiment.

(5) The elastic supporting body assembly 220 elastically supports the power semiconductor 100. Accordingly, in the case when the surface 100*f* of the power semiconductor 100 and the surface 21*f* of the contact portion 21 of the contact body 2 are in contact with each other, the impact to the power semiconductor 100 is absorbed by the elastic supporting body assembly 220, and thus, the load on the power semiconductor 100 is further reduced, so that the resistance of the power semiconductor 100 to the impact weight is improved. Therefore, it is possible to shorten the cycle time by increasing the operating speed to 5 mm/sec from 1.7 mm/sec, which is the operating speed in the related art.

It should be noted that the present invention is not limited to the above-described embodiments, and modifications, improvements, and the like which are carried out within a scope in which objects of the present invention can be achieved are also included in the scope of the present invention.

In the embodiment, the four first pressing pins 31*a* are arranged corresponding to the four corners of the contact portion 21 of the contact body 2. However, the present invention is not limited thereto. For example, as described above in the embodiment, each of the groups including a plurality of first pressing pins 31*a* may be arranged corresponding to each of the four corners of the contact portion 21 of the contact body 2. In addition, the plurality of first pressing pins 31*a* may be arranged along the periphery of the contact portion 21 of the contact body 2 or may be arranged in an annular shape to be separated at equal distances from the center. Besides, the plurality of first pressing pins 31*a* may be arranged to be well balanced so as to uniformly distribute the pressing force over the contact body 2.

What is claimed is:

1. A parallelism adjusting device for adjusting the parallelism between a surface of a semiconductor and a surface of an electrode which is in contact with the surface of the semiconductor to press the surface of the electrode and apply a current, the parallelism adjusting device comprising:
a pressing body which allows the surface of the electrode to be inclined so as to follow the inclination of the surface of the semiconductor and presses the electrode on to the semiconductor to be electrified when the surface of the semiconductor and the surface of the electrode are in contact with each other,
wherein the surface of the electrode has a quadrangular shape,
wherein the pressing body has a plurality of elastic bodies which relatively come close to the surface of the semiconductor in a simultaneous manner,
wherein the plurality of elastic bodies include first elastic bodies which are arranged in a distributive way, at a back surface side of the electrode, corresponding to four corners of the surface of the electrode, and second elastic bodies other than the first elastic bodies,
wherein the first elastic bodies firstly come in contact with the back surface side of the electrode, and after allowing the surface of the electrode to be inclined, the second elastic bodies come in contact with the back surface side of the electrode, and press the electrode with a pressing force which is stronger than a pressing force of the first elastic bodies,
wherein the pressing body includes a plurality of elastic bodies which are compressed to allow the surface of the electrode to be inclined so as to follow the inclination of the surface of the semiconductor when the surface of the semiconductor and the surface of the electrode are in contact with each other,
wherein a portion of the elastic bodies are in contact with the electrode to press the electrode with the predetermined pressing force before the surface of the semiconductor and the surface of the electrode come into contact with each other, and
wherein the other elastic bodies are in contact with the electrode to press the electrode with a pressing force which is stronger than the predetermined pressing force after the surface of the semiconductor and the surface of the electrode come into contact with each other.

2. The parallelism adjusting device according to claim 1, further comprising
an elastic supporting body which elastically supports the semiconductor.

3. A parallelism adjusting method for adjusting the parallelism between a surface of a semiconductor and a surface of an electrode which is in contact with the surface of the semiconductor to press the surface and apply a current, the parallelism adjusting method comprising:
narrowing a relative distance between the surface of the semiconductor and the surface of the electrode until portions of the two surfaces are in contact with each other;
allowing the surface of the electrode to be inclined so as to follow the inclination of the surface of the semiconductor while narrowing the relative distance; and
after allowing the surface of the electrode to be inclined, pressing the surface of the electrode on to the surface of the semiconductor, by way of a plurality of elastic bodies which relatively come close to the surface of the semiconductor in a simultaneous manner, the plurality of elastic bodies including first elastic bodies which are arranged in a distributive way, at a back surface side of the electrode, corresponding to four corners of the surface of the electrode having a quadrangular shape, and second elastic bodies,
wherein, in the allowing of the surface of the electrode to be inclined, the first elastic bodies contact the back surface side of the electrode to allow the surface of the electrode to be inclined so as to follow the inclination of the surface of the semiconductor,
wherein, in the pressing of the surface of the electrode on to the surface of the semiconductor, after allowing the surface of the electrode to be inclined, the second elastic bodies come in contact with a back surface of the electrode, and press the surface of the electrode on to the surface of the semiconductor with a pressing force which is stronger than a pressing force of the first elastic bodies,
wherein, in the narrowing of the relative distance, the relative distance is narrowed at a predetermined speed, and wherein, in the allowing of the surface of the electrode to be inclined, the relative distance is narrowed at a speed which is lower than the predetermined speed.

\* \* \* \* \*